(12) United States Patent
Eckelman et al.

(10) Patent No.: US 7,930,601 B2
(45) Date of Patent: Apr. 19, 2011

(54) AC ABIST DIAGNOSTIC METHOD, APPARATUS AND PROGRAM PRODUCT

(75) Inventors: Joseph Eckelman, Hopewell Jct., NY (US); Donato O. Forlenza, Hopewell Junction, NY (US); Orazio P. Forlenza, Hopewell Junction, NY (US); William J. Hurley, Walpole, MA (US); Thomas J. Knips, Wappingers Falls, NY (US); Gary William Maier, Poughquag, NY (US); Phong T. Tran, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 376 days.

(21) Appl. No.: 12/035,515

(22) Filed: Feb. 22, 2008

(65) Prior Publication Data
US 2009/0217112 A1 Aug. 27, 2009

(51) Int. Cl.
*G11C 29/00* (2006.01)
(52) U.S. Cl. ........ 714/723; 714/721; 714/719; 714/720; 714/718; 714/726; 714/5; 714/8; 714/25; 714/30; 714/42; 714/48; 714/733; 714/734; 714/735; 714/736; 714/742; 365/201
(58) Field of Classification Search .................. None
See application file for complete search history.

(56) References Cited

U.S. PATENT DOCUMENTS

| | | |
|---|---|---|
| 3,761,695 A | 9/1973 | Eichelberger |
| 4,503,386 A | 3/1985 | Gupta et al. |
| 4,630,270 A | 12/1986 | Petit et al. |
| 5,313,424 A | 5/1994 | Adams et al. |
| 5,640,402 A | 6/1997 | Motika et al. |
| 5,657,332 A | 8/1997 | Auclair et al. |
| 5,859,804 A | 1/1999 | Hedberg et al. |
| 5,912,901 A * | 6/1999 | Adams et al. ............... 714/733 |
| 5,951,703 A | 9/1999 | Sprouse et al. |
| 6,278,956 B1 | 8/2001 | Leroux et al. |
| 6,308,290 B1 | 10/2001 | Forlenza |
| 6,385,750 B1 | 5/2002 | Kapur et al. |
| 6,442,720 B1 | 8/2002 | Koprowski et al. |
| 6,618,826 B1 | 9/2003 | Chen et al. |
| 6,643,807 B1 * | 11/2003 | Heaslip et al. ............... 714/719 |

(Continued)

FOREIGN PATENT DOCUMENTS

JP 62195169 8/1987

(Continued)

OTHER PUBLICATIONS

"Generating At-Speed Array Fail Maps with Low-Speed ATE", Nelms et al., IEEE VLSI Test Symposium, 2004.*

(Continued)

*Primary Examiner* — John P Trimmings
(74) *Attorney, Agent, or Firm* — William A. Kinnaman, Jr.

(57) ABSTRACT

A method for implementing at speed bit fail mapping of an embedded memory system having ABIST (Array Built In Self Testing), comprises using a high speed multiplied clock which is a multiple of an external clock of an external tester to sequence ABIST bit fail testing of the embedded memory system. Collect store fail data during ABIST testing of the embedded memory system. Perform a predetermined number of ABIST runs before issuing a bypass order substituting the external clock for the high speed multiplied clock. Use the external clock of the tester to read bit fail data out to the external tester.

16 Claims, 7 Drawing Sheets

U.S. PATENT DOCUMENTS

| | | | |
|---|---|---|---|
| 6,662,327 | B1 | 12/2003 | Rajski |
| 6,694,454 | B1 | 2/2004 | Stanley |
| 6,807,646 | B1 | 10/2004 | Williams et al. |
| 6,950,974 | B1 | 9/2005 | Wohl et al. |
| 6,978,402 | B2 * | 12/2005 | Hirabayashi ............ 714/42 |
| 6,993,694 | B1 | 1/2006 | Kapur et al. |
| 7,010,735 | B2 | 3/2006 | Motika et al. |
| 7,017,095 | B2 | 3/2006 | Forlenza et al. |
| 7,058,869 | B2 | 6/2006 | Abdel-Hafez et al. |
| 7,159,145 | B2 | 1/2007 | Wang et al. |
| 7,206,979 | B1 | 4/2007 | Zarrineh et al. |
| 7,225,374 | B2 | 5/2007 | Burdine et al. |
| 7,395,469 | B2 | 7/2008 | Anderson et al. |
| 7,444,564 | B2 | 10/2008 | Anand et al. |
| 2002/0125907 | A1 | 9/2002 | Kurtulik et al. |
| 2003/0084387 | A1 | 5/2003 | Rooney et al. |
| 2003/0131294 | A1 | 7/2003 | Motika et al. |
| 2003/0229834 | A1 | 12/2003 | Cooke |
| 2004/0003329 | A1 | 1/2004 | Cote et al. |
| 2004/0230870 | A1 * | 11/2004 | Wang et al. ............ 714/30 |
| 2005/0120270 | A1 * | 6/2005 | Anand et al. ............ 714/30 |
| 2005/0166111 | A1 * | 7/2005 | Chien ............ 714/733 |
| 2005/0229057 | A1 | 10/2005 | Anderson et al. |
| 2007/0124637 | A1 * | 5/2007 | Goldrian et al. ............ 714/738 |
| 2008/0082874 | A1 * | 4/2008 | Kato ............ 714/723 |

FOREIGN PATENT DOCUMENTS

| | | | |
|---|---|---|---|
| JP | 7078495 | | 3/1995 |
| JP | 2002243801 | * | 8/2002 |
| JP | 2002298598 | * | 10/2002 |

OTHER PUBLICATIONS

"Theory and Implementation of LSSD Scan Rang & STUMPS Channel Test and Diagnosis" by G. A. Sarrica et al, Sep. 28-20, 1992, Electronics Manufacturing Technology Symposium, 1992, 13th IEEE/CHMT International, pp. 195-200.

"Semiconductor Manufacturing Process Monitoring using Built-In-Self-Test for Embedded Memories" by I. Schanstra et al, International Test Conference, 1998 IEEE Proceedings, Paper 34.3, pp. 872-881.

"A Technique for Fault Diagnosis of Defects in Scan Chains" by R. Guo et al, IEEE—ITC International Test Conference, Paper 10.2, pp. 268-277.

"Gate Level Fault Diagnosis in Scan-Based BIST" by I. Bayraktaroglu et al, Proceedings of the 2002 Design Automation and Test in Europe Conference, IEEE Computer Society, pp. 1-6.

* cited by examiner

AC ABIST DIAGNOSTIC METHOD, APPARATUS AND PROGRAM PRODUCT

CROSS-REFERENCE TO RELATED APPLICATIONS

This application contains subject matter which is related to the subject matter of the following co-pending applications, each of which is assigned to the same assignee as this application, International Business Machines Corporation, Armonk, N.Y. Each of the below listed applications is hereby incorporated herein by reference in its entirety: U.S. pat. publication No. 2005/0120270, now U.S. Pat. No. 7,444,564 of Anand et al for "Automatic Bit Fail Mapping for Embedded Memories with Clock Multipliers"; and U.S. pat. publication No. 2005/0229057, now U.S. Pat. No. 7,395,469, of Anderson et al. for "Method, Apparatus, and Computer Program Product for Implementing Deterministic Based Broken Scan Chain Diagnostics."

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to detecting location of bit fails in a memory array, and particularly to bit failure (bit fail) mapping of an embedded memory system employing Array Built-In Self-Test (ABIST) to detect bit fails.

2. Description of Background

A number of different methods currently exist to diagnose scan chain failures in an electronic chip. See, for example, U.S. Pat. No. 3,761,695 of Eichelberger for "Method of Level Sensitive Testing a Functional Logic System"; U.S. Pat. No. 6,308,290 B1 of Forlenza et al. for "Look Ahead Scan Chain Diagnostic Method"; U.S. Pat. No. 6,643,807 of Heaslip et al, for "Array-Built-In-Self-Test (ABIST) for Efficient, Fast, Bitmapping of Large Embedded Arrays in Manufacturing Test"; U.S. Pat. No. 7,010,735 by Motika et al. for "Stuck-At Fault Scan Chain Diagnostic Method"; U.S. Pat. No. 7,017,095 of Forlenza et al. for Diagnostic Method for Detection of Multiple Defects in a Level Sensitive Scan Design (LSSD); U.S. Pat. No. 7,159,145 of Wang et al, for "Built-In Self Test System and Method"; and U.S. Pat. No. 7,225,374 of Burdine for "ABIST-Assisted Detection of Scan Chain Effects"; all owned by the assignee of the present invention and incorporated herein by reference.

Typically, however, no one method is by itself sufficient to diagnose a scan chain fail in a chip with enough confidence to send it to the Physical Failure Analysis (PFA) function of analyzing the failure to determine the cause thereof and to correct the process for making the chip to prevent that particular failure in future runs. These methods are self-contained entities, and are not structured to interface with one another. Much time is spent in determining which method(s) to utilize and in exercising these methods manually. Even if a method is automated via a software medium (i.e. in a computer system), nevertheless, manual intervention is required to determine which method(s) to use, to capture the results from each method, and to analyze the results from each method to determine which device to send to PFA.

Substantial amounts of time on the order of days, and sometimes weeks are required in order to diagnose a sufficient number of failing devices to send to a device to PFA. During the days and weeks of delay, the manufacturing fabrication line (fab) continues to produce products which are likely to contain the same defects. Therefore, yields often remain low, which results in significant cost-impacts. Thus, it is critical that failing parts should be diagnosed as quickly as possible to minimize the amount of defective product that continues to be processed through a wafer fabrication (fab) facility.

U.S. Pat. No. 7,206,979 of Zarrineh et al. for "Method and Apparatus for "At-Speed Diagnostics of Embedded Memories" describes a method of testing an embedded memory which includes providing a programmable memory module and using the programmable memory BIST module to extract contents of the embedded memory upon detection of an error. The programmable memory BIST module includes a pseudo binary search and stop on error function.

U.S. published pat. appl. No. 2005/0120270 by Anand et al, (cited above) points out that as embedded memory sizes, overall BIST (Built In Self Test) testing time increases; so novel schemes that reduce test time while maintaining test integrity and diagnostic resolution are desirable. One issue is that ATE (Automated Test Equipment) tester clock, is not fast enough to accommodate BIST testing. This can be addressed by having the BIST run off an internal clock that is a multiplied frequency of the ATE tester clock. However, the ability to accurately bit fail map a memory that is tested by an internal multiplied clock is inhibited by the inability to stop the test circuitry at the exact point when a fail is encountered, shift out the fail data, and then resume the test successfully.

Anand et al. describes a bit fail map circuit which accurately generates a bit fail map of an embedded memory such as a DRAM by utilizing a high speed multiplied clock generated from a low-speed ATE tester. The high speed multiplied clock is generated by an on-chip clock multiplier which multiplies the external clock. The circuit communicates between the ATE tester, the embedded memory under test, Built-In Self-Test (BIST) and Built-In Redundancy Analysis (BIRA). An accurate bit fail map of an embedded DRAM memory is provided by pausing the BIST test circuitry at a point when a fail is encountered, namely a mismatch between BIST expected data and the actual data read from the array, and then shifting the bit fail data off the chip using the low-speed ATE tester clock. Thereafter, the high-speed test is resumed from point of fail by again running the BIST using the high-speed internal clock, to provide at-speed bit Fail Maps. The method identifies the bit-mapped fault detected by at-speed execution, when an on-chip clock multiplier is used for testing. Anand et al U.S. Pat. Publication also states that use of BIST helps to alleviate the capital cost of a high performance ATE, however at the expense of silicon overhead, and that on chip clock frequency multiplication (PLL's, DLL's, etc.) enables at-speed BIST testing with a low cost, low-speed tester. On-chip memories can thus be tested at-speed with a low-speed ATE tester.

Wang et al, U.S. Pat. No. 7,159,145 (above) describes prior art on the inclusion of a structure and method in an integrated circuit which includes read/write memory, for the support of an ABIST. Wang et al shows a structure in an integrated circuit that includes a read/write memory and describes a method for the support of an ABIST.

Figure 1:
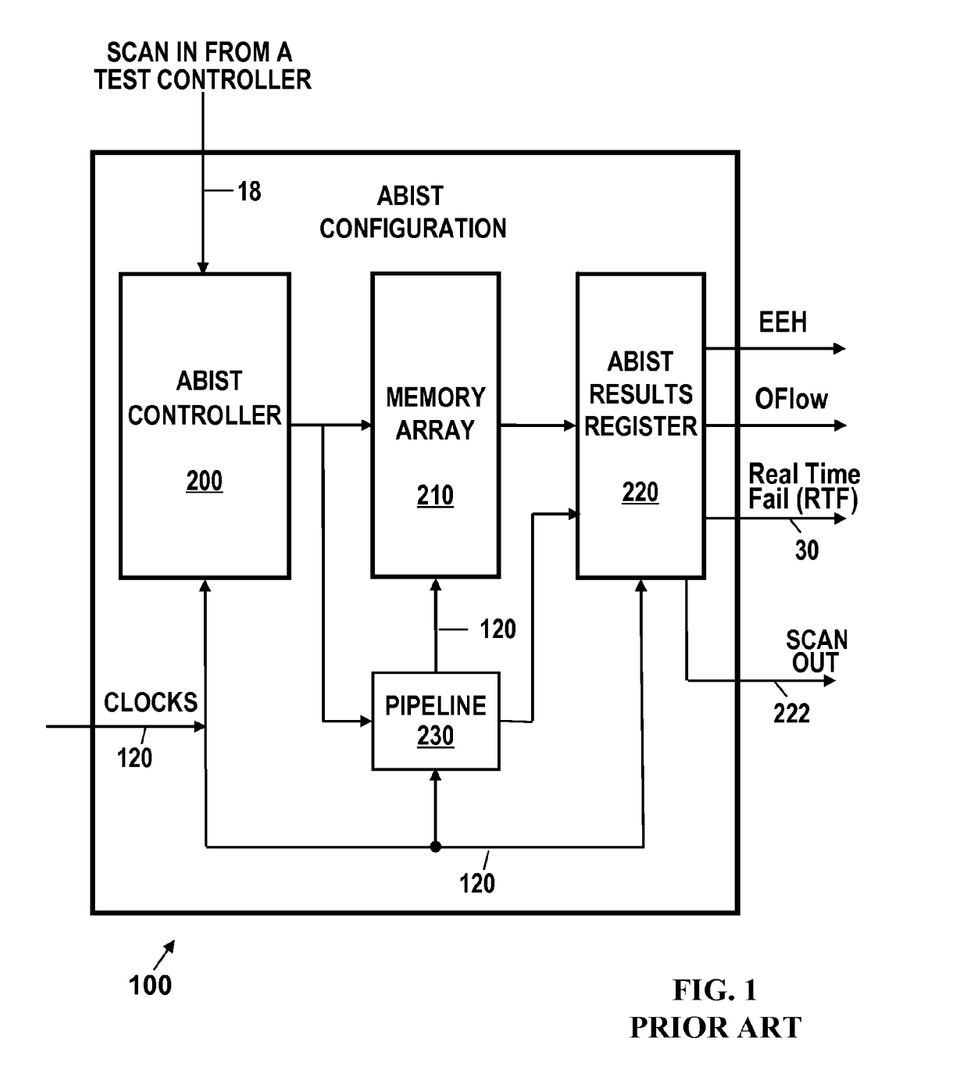
FIG. 1 is a block diagram of a prior art ABIST configuration for detecting location of bit fails in a memory array, and particularly to bit fail mapping of an embedded memory system employing ABIST to detect bit fails in the memory array.

The general method is depicted in FIG. 1 which is a block diagram of a prior art ABIST configuration 100 for detecting location of bit fails in a memory array, and particularly to bit fail mapping of an embedded memory system employing ABIST to detect bit fails in the memory array. A test controller supplies a scan input to an ABIST controller 200. The ABIST Controller 200 exercises the memory element 210, and a pipeline 230 which supply expected results to an ABIST Results Register 220 with a Scan Out line 222. The pipeline uses common clocks 120 to supply inputs to the to the ABIST Results Register 220 in a staged timing path which aligns the expected data to the Results Register 220, with the actual data from the Memory element 210. Conventional clocks 120 are supplied to the ABIST Controller 200, the pipeline 230, and the ABIST Results Register 220.

The ABIST Controller 200, is used to exercise the memory array 210, and pipeline 230 expected results to the results register 220. The function of the pipeline 230, is to provide a timed path delay for the expected results data from the ABIST Controller 200, to compensate for the propagation delay of the data from the memory array 210 to the results register 220. The results register 220 compares the data from the Memory Element 210 and the expected data generated by the ABIST Controller 200. If the data does not match, an error has occurred and the Real Time Fail (RTF 30) flag is set, out of the ABIST results register 220.

Heaslip et al, U.S. Pat. No. 6,643,807 (above) describes detecting failed cycles at a Real Time Fail Pin (RTFP). Heaslip et al also describes a method of identifying failing cells of a bad memory element, bitmapping the array, which is facilitated by sending a Real Time Fail (RTF) indicator on line 30 to an external system, when a fault is detected as n.

SUMMARY OF THE INVENTION

The shortcomings of the prior art are overcome and additional advantages are provided through the provision of a method of operating an ABIST system to identify the bit-mapped fault detected by at-speed execution, when an on-chip clock multiplier activated by an external clock in a testing system is used for testing.

In accordance with this invention, a method for implementing at speed bit fail mapping of an embedded memory system having ABIST (Array Built In Self Testing), comprises using a high speed multiplied clock which is a multiple of an external clock of an external tester to sequence ABIST bit fail testing of the embedded memory system. Collect store fail data during ABIST testing of the embedded memory system. Perform a predetermined number of ABIST runs before issuing a bypass order substituting the external clock for the high speed multiplied clock. Use the external clock of the tester to read bit fail data out to the external tester.

The method of the present invention combines the detection of fail data and controlling the on chip clocks, as contrasted with the Anand et al. method which employs on chip circuitry with a fixed delay. Use of a fixed delay can be restrictive if different values of the multiplier are used for the PLL, if the error detection delay is constant.

In accordance with an aspect of this invention, a method is provided for implementing at speed bit fail mapping of a memory system embedded on a chip with ABIST (Array Built In Self Testing) system, comprises testing the chip with an off-chip device by applying an external clock operating at a first frequency to the chip. Generate an internal high speed multiple of the first frequency; to sequence ABIST bit fail testing of the embedded memory system. Detect which cycle of the multiplied clock corresponds to a fail occurring during ABIST testing of the memory system. Perform a predetermined number of ABIST runs before issuing a bypass order substituting the external clock for the high speed multiplied clock. Use the external clock of the tester to read bit fail data out to the external tester.

Preferably, perform detection of a failing cycle independently of a programmed multiplier used to create the internal high speed clock; each fail occurrence at a specific phase of the internal high speed clock is stored and detected by external ATE (Automated Test Equipment); whereby detection of the an exact failing cycle is accomplished without interrupting an at-speed test. Preferably the off-chip device comprising an ATE tester using an on-chip clock multiplier to produce frequency multiplication of the external clock of the ATE tester to generate the internal high speed clock; detecting a fail during n at-speed cycle thereby allowing for execution to a precise execution cycle of a test, and propagating fail data to the ATE tester from on-chip detection and storage circuitry after a number of cycles of testing with the high speed clock; and storing a location of a the fail in a memory in the ATE tester upon recognition of the fail without requiring a scan operation off the chip to the ATE tester; and applying the high speed clock to the ABIST system until a plurality of runs have been completed to store real time fail data; and applying the external clock to the ABIST system after the plurality of runs and then unloading real time fail data into the off-chip device.

In accordance with yet another aspect of this invention, a method is provided for high speed bit fail mapping of a embedded in a chip having ABIST by an external tester having an external clock with minimal interaction from the external tester with the external clock operating at a first clock frequency, comprising running ABIST testing with an On Chip Clock Generator (OPCG) providing an at-speed internal clock with a high frequency comprising a multiple of the first clock frequency for ABIST testing, and then bypassing the at-speed oscillator on an exact cycle of ABIST execution.

Preferably, include bit fail mapping of an embedded RAM (Random Access Memory); using an on-chip clock multiplier to multiply the external clock to generate the high speed multiplied clock; using the on-chip clock multiplier to multiply the external clock of an off-chip ATE (Automatic Test Equipment) tester to generate the high speed multiplied clock; storing fail location data of a the fail in fail location latches in a results register in the ABIST engine upon recognition of a the fail; and unloading fail loading data to an external memory device upon completion of at least a multiple of M cycles of ABIST fail testing. Preferably provide a first input from the external clock; provide a second input from the internal high speed multiplied clock, and pass either the first input from the external clock or the second input from the high speed multiplied clock to the ABIST system.

In accordance with another aspect of this invention, a circuit for implementing at speed bit fail mapping of an embedded memory system having a ABIST (Array Built In Self Testing) engine on a chip, comprises an off-chip tester connected to apply an external clock operating at a first frequency to the chip; an internal clock operating at a high frequency comprising a multiple of the first frequency which sequences ABIST bit fail testing of the embedded memory system; the circuit detecting which cycle of the internal clock corresponds to a fail occurring during ABIST testing of the memory system; the circuit performing a predetermined number of ABIST runs before issuing a bypass order substituting the external clock for the internal clock; and the circuit using the external clock of the tester to read bit fail data out to the external tester.

Preferably, during re-execution of a test, a failing cycle can be exactly achieved by stopping the internal clock on an exact multiple of the external clock; and the circuit providing automatic bit fail mapping of an embedded RAM, including an on-chip clock multiplier for multiplying the tester clock of an off-chip ATE tester to produce the speed of the internal clock, whereby execution of a test is not perturbed by stopping clocks at a fail and then re-starting.

In accordance with still another aspect of this invention, a program product enables at speed bit fail mapping of an memory system embedded in a chip without employing: separate storage registers for data collection; and observation of data from the chip on any given cycle around a failing cycle to provide additional data for diagnosis.

Preferably, the program product includes bit fail mapping of an embedded RAM; an on-chip clock multiplier multiplies the external clock to generate the high speed multiplied clock; the on-chip clock multiplier multiplies an external clock of an off-chip ATE tester to generate the high speed multiplied clock; and a high speed clock is applied to an ABIST system until a plurality of runs have been completed to store real time fail data; an external clock is applied to the ABIST system after the plurality of runs; and real time fail data is then unloaded into an off-chip device.

The present invention allows flexibility in determining when a fail occurs within the at-speed cycle time independent of the value of the multiplier, by moving the ATE strobe. Also, the test function without interruption or stopping avoiding the problems caused by interruptions or stopping which may cause differences in the fail type for subsequent defect detection; avoiding the problem of restarting the ABIST controller, which is likely to change the intended execution.

A system and computer program products corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 2:
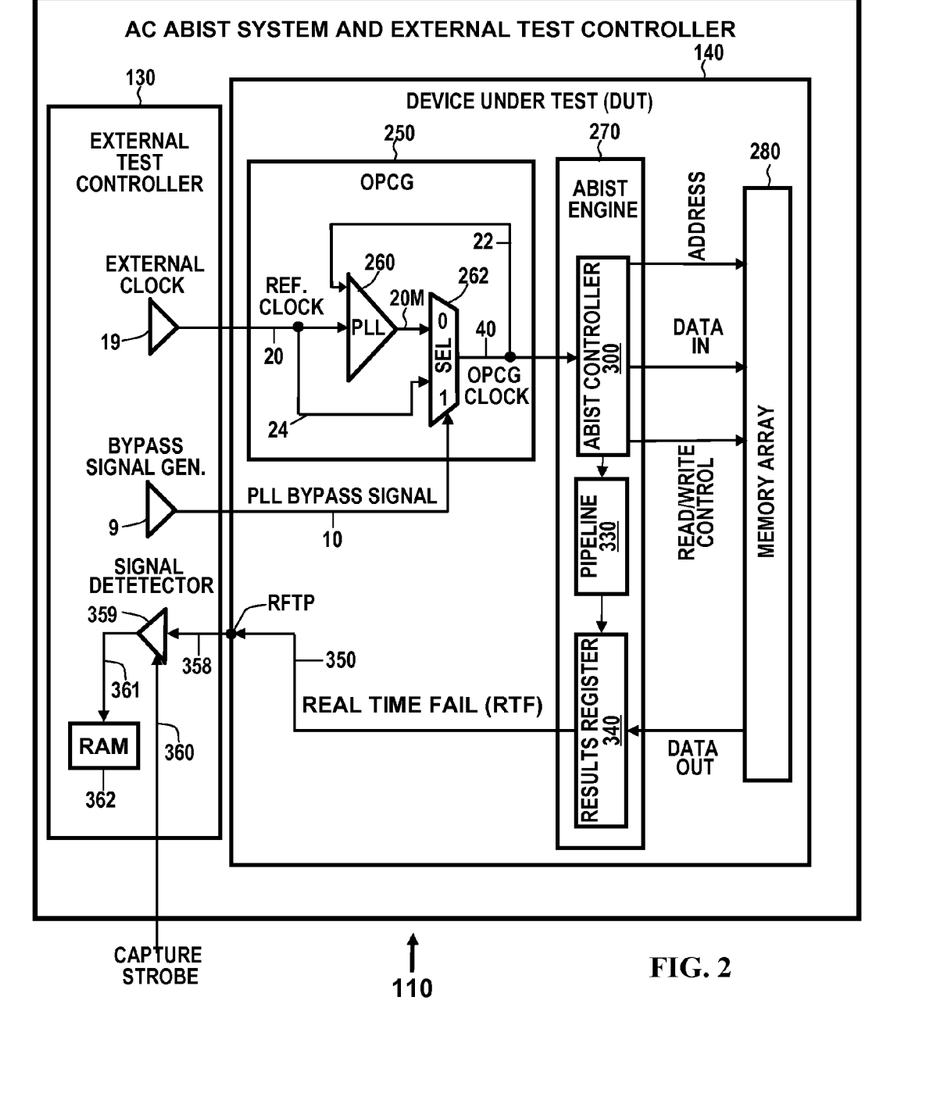
FIG. 2 is a block diagram of an At-Speed Array ABIST system and a clock structure in accordance with this invention which includes an external test controller for testing elements of a Device Under Test (DUT)

Turning now to the drawings in greater detail, it will be seen that in FIG. 2 there is a block diagram illustrating the method in accordance with this invention for identifying failing cells of a bad memory element, bitmapping the array, is facilitated by sending a Real Time Fail (RTF) indicator signal on line 30 to an external system, when a fault is detected as described in Heaslip et al U.S. Pat. No. 6,643,807, above which allows for at-speed execution of the ABIST from a slow speed external (reference) clock multiplied on chip, as described in U.S. Published Patent Application No. 2005/0120270 of Anand et al., above.

FIG. 2 is a block diagram 110 of an at-Speed Array ABIST system and clock structure in accordance with this invention which includes an external test controller 130 and a Device Under Test (DUT) 140. The DUT 140 includes therein an On Product (on chip) Clock Generator (OPCG) 250, an ABIST engine 270, and a memory array 280 which is an example of an element to be tested.

The external test controller 130 includes an external (reference) clock signal generator 19 (referred to hereinafter as the external clock 19) with an output line 20, a bypass signal generator 9 with a PLL bypass output line 10 and a signal detector 359 with an input line 358 and a capture strobe line 360 which enable the signal detector to receive fail data from the ABIST engine 270. External clock 19 supplies an external clock signal on line 20 with a reference signal frequency to both a Phase Lock Loop (PLL) 260, and via line 24 to the "1" input of the SELector switch (SEL) 262 in the OPCG 250 in the DUT 140.

The Phase Lock Loop (PLL) 260 multiplies the frequency of the external clock signal on line 20 producing a higher frequency PLL output signal on line 20M to achieve the minimum cycle times required to observe the at speed AC Memory Cell failures embedded in the Memory Arrays 280. Line 20M is connected to the "0" input of the SEL 262.

The SEL 262 is an electronic equivalent of a Single Pole Double Throw (SPDT) switch; and the SEL 262 is biased to the "0" position allowing the PLL output on line 20M to pass through OPCG Clock line 40 to the ABIST controller 300 in the ABIST engine 270, except when the SEL 262 switches to the "1" position. In other words, when the PLL bypass signal on PLL bypass output line 10 from bypass signal generator is low, the output signal on line 20M from the PLL 260 passed on line 40 into the ABIST engine 270, but otherwise the external signal on lines 20 and 24 is transmitted to the ABIST controller 300. The ABIST controller 300 has an output connected to the input of ABIST pipeline 330. The output of the ABIST pipeline 330 is connected to the input of the ABIST results register 340 of ABIST engine 270.

There is a feedback loop 22 from line 40 to an input to the PLL 260 which adjusts performance of the PLL 260 as a function of the output signal on line 40, which is described below.

The bypass signal generator 9 supplies a PLL bypass signal on PLL bypass output line 10 to the control input to the SEL 262 to switch it to the "1" position, thereby cutting off the PLL signal from the OPCG clock line 40, and passing the lower frequency external clock signal on lines 20 and 24 through the OPCG clock line 40 to the input to the ABIST controller 300.

The external signal detector 359 receives a Real Time Fail (RTF) signal on line 358 from the Real Time Fail Pin (RFTP) which has received fail results on RFTP output line 350 from the ABIST results register 340 of the ABIST engine 270. In addition, the signal detector 359 supplies a capture strobe signal on 360 which is transmitted externally into the test controller 130. The signal detector 359 sends the store fail data on line 361 to store fail data in a Random Access Memory (RAM) 362, e.g. a Dynamic RAM (DRAM) during capture strobes, when a PLL bypass signal on PLL bypass output line 10 has been generated by the bypass signal generator 9 in the external test controller 130 in FIG. 2.

To capture and observe the exact failing memory cell at speed requires the special method described below.

Referring again to FIG. 2, as indicated above, the on chip OPCG 250 comprises a clock generator, and the PLL 260 multiplies the on chip clock frequency. The PLL 260 is employed to be able to achieve the minimum cycle times required to observe the AC Memory Cell failures, in a set of embedded memory arrays 280 at speed is provided for generating signals to be used for identifying the bit-mapped fault detected by at-speed execution, when an on-chip clock multiplier is used for testing. To capture and observe the exact failing memory cell at speed requires the special method described below The OPCG 250 requires two features which make it possible to control the on chip clock generation and to capture (i.e. detect) the fail within the failing cycles. In FIG. 2, the first feature is the bypass clock on the PLL bypass output line 10 mode which activates a SEL 262 (which is an electronic equivalent of a Single Pole Double Throw (SPDT) switch) to bypass the output of the OPCG multiplier PLL 260 and the ability to capture the detected fail by capturing the RTF signal on line 350 with a capture strobe on line 360 positioned within the cycle of the external clock signal on line 20.

This enables the switching of the output frequency on the OPCG Clock line 40 supplied to the ABIST engine 200 between the high frequency from the multiplied External Clock line 20M (output of the PLL 260), to the frequency of the input on lines 20 and 24 from the external clock 19 and back again.

Figure 3A:
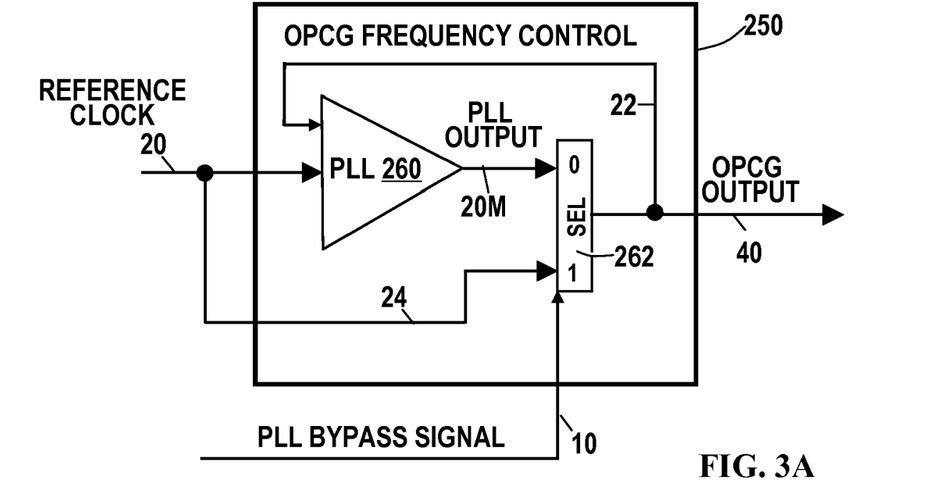
FIG. 3A is a diagram of the On Chip Clock Generator (OPCG) frequency control of the system of FIG. 2.
Figure 3B:
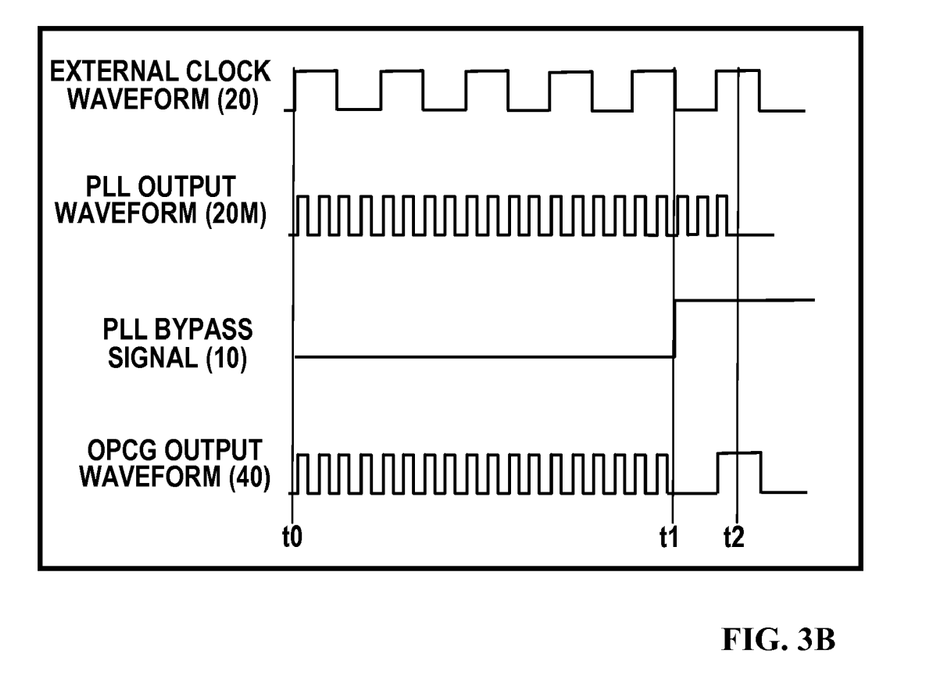
FIG. 3B is a timing diagram of electrical signals associated with the at-speed clock structure for use with the ABIST system of FIG. 2.

FIG. 3A is a diagram of the On Chip Clock Generator (OPCG) frequency control of the system of FIG. 2. FIG. 3B is timing diagram of electrical signals in the ABIST clock structure of the system of FIG. 2. When the PLL bypass signal on PLL bypass output 10 is down as at time t0 in FIG. 3B, the external clock signal on line 20 activates the PLL 260 to generate the PLL output on line 20M at a high frequency which is a multiple of that on line 20. When the PLL bypass signal on PLL bypass output 10 rises at time t1 in FIG. 3B, the output on line 40 is reduced in frequency to that of the signal on line 20. On or about time t2, the frequency on the feedback loop 22 to the PLL 260 drives the PLL output on line 20M down. When the PLL bypass signal on PLL bypass output line 10 drops, the PLL 260 will again produce a high frequency output signal on line 20M.

Figure 4:
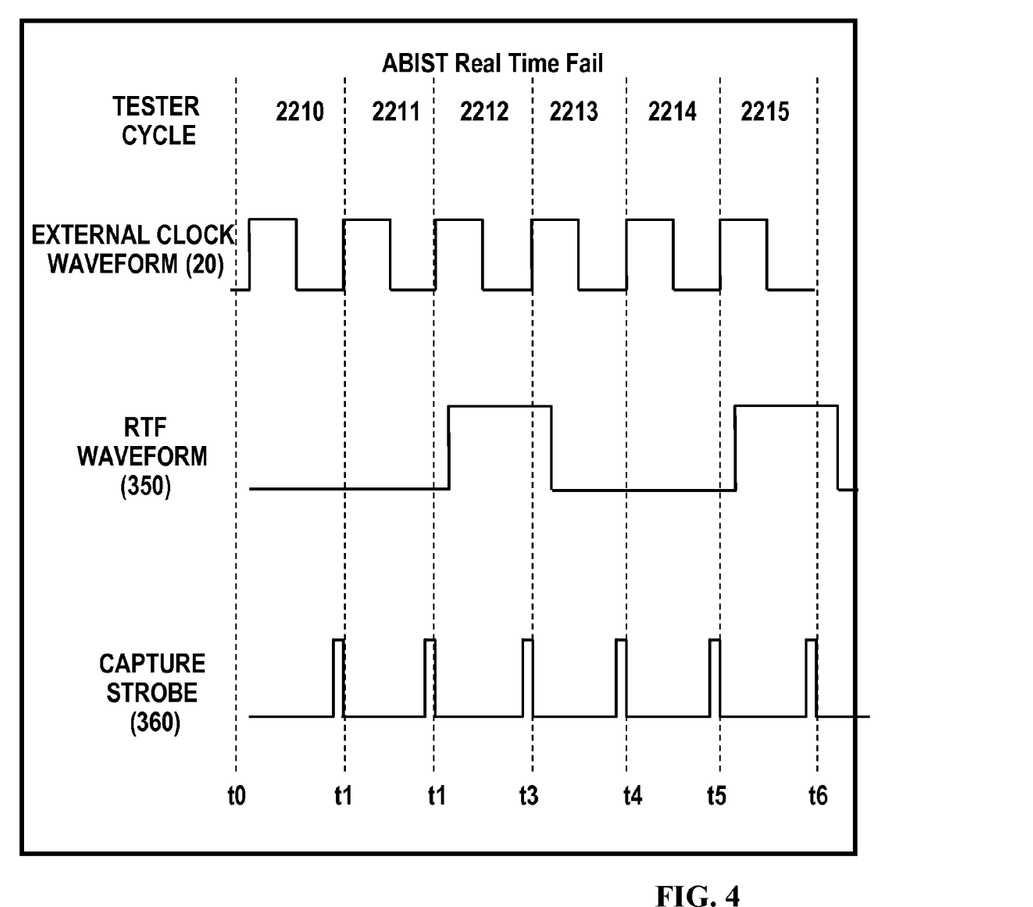
FIG. 4 is a timing diagram of real time fail signals in the ABIST clock structure of the system of FIG. 2.

As illustrated in FIG. 4, the PLL 260 will produce a clock output at the desired frequency, when utilizing the OPCG 250 to exercise the Memory Array 210 at speed, the RTF signal on line 30 can occur and reset anywhere within the test cycle (defined by the External Clock signal cycle on line 20). A fail occurrence can then be missed if the tester capture strobe on line 360 is placed at the wrong point in the cycle of the external clock signal on line 20. In FIG. 4, the capture strobes will be effective at times t3 and t6, but not at times t1, t2, t4 and t5 since the RTF signal on line 350 will be down for those capture strobes.

Figure 5:
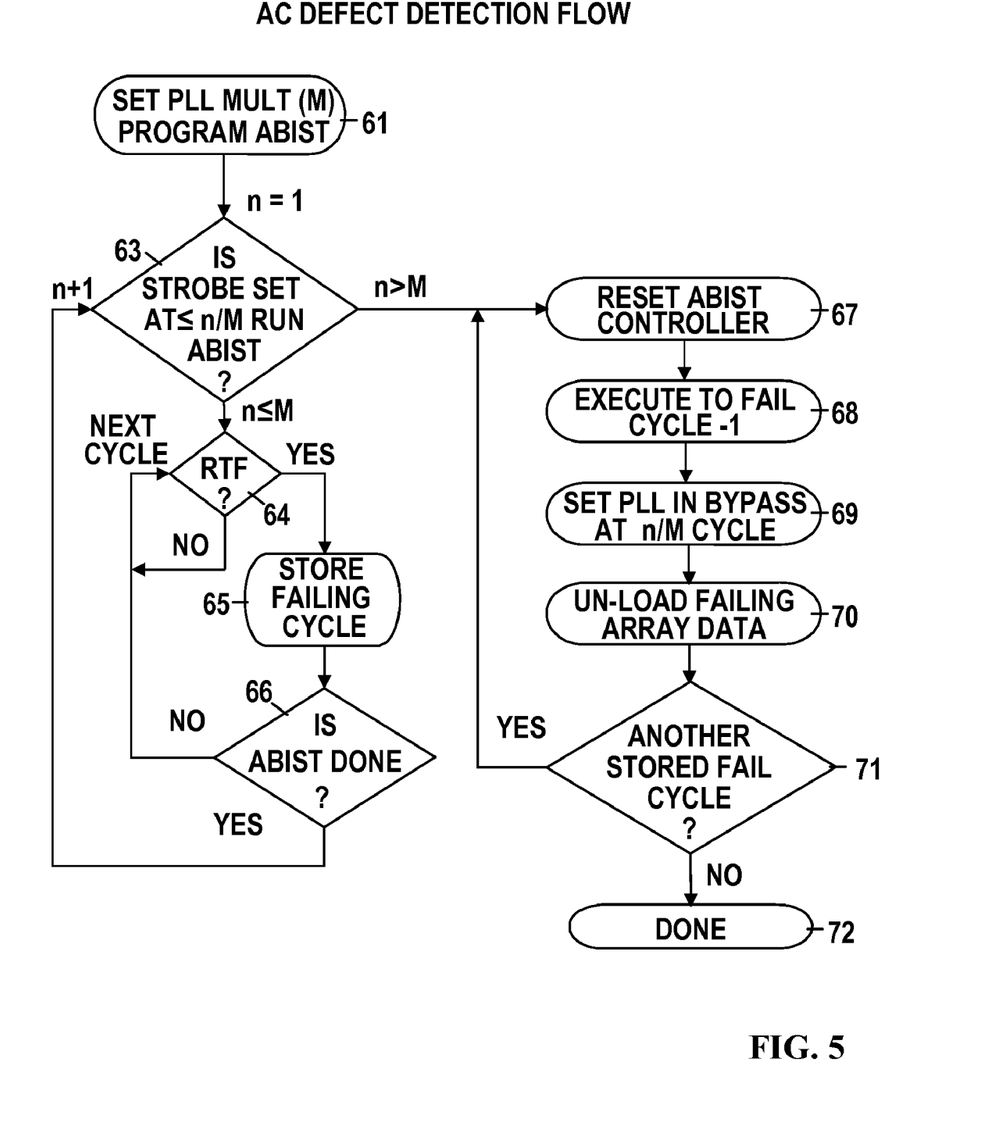
FIG. 5 is a flow chart of the performance of the AC ABIST Diagnostic system in accordance with this invention.

FIG. 5 is a flow chart of the method of detecting the AC defect in accordance with this invention. To capture the at speed failing cycles this method requires M passes of ABIST, where M is the multiply factor to which the OPCG PLL is programmed as indicated by block 61 starting with n=1. During each pass through ABIST the capture strobe is set to be generated at a different point by the strobe set decision block 63 within the tester external clock cycle. In other words, no strobe signal will be generated on line 360 of FIG. 2 until the strobe set decision block has determined that n>M.

The first pass of generation of the capture strobe on line 360 is set (with n=1) at 1/M×External (Reference) Oscillator Cycle Time (CT), minus an offset equal to the tolerance of the strobe placement capability (SO). The second pass of the Capture Strobe on line 360 is set at M/M×CT-SO. Since the RTF signal on line 350 is a derivative of the ABIST miscompare, it will set and reset multiple times within a single tester external clock cycle. The RTF signal on line 350 is sampled at each strobe point by the RTF test block 64, which determines whether a fail has occurred.

If the result of the test by block 64 is NO, i.e. no fail has been detected, the system cycles back to block 64 until a fail is detected. When a fail is detected (YES), block 64 sends a YES signal to the store failing cycle block 65 which records the failing cycle and passes it to the "ABIST done?" test block 66.

The ABIST done block 66 determines whether the ABIST testing cycle has been completed. If NO, the block recycles the program through the RTF? test block 64. If YES, the program returns to the strobe set decision block 63 with an incremental value of n+1 to the value of n to be compared with the value M which determines how many passes are to be made from strobe set decision block 63 to RTF? test block 64. The pass index (1, 2, 3 . . . M0 will be referred to as "s". If n≦M, the system branches back to the RTF test block 64.

Another feature required is the ability to stop the output of the On Product Clock Generation (OPCG) on a specific cycle of the at-speed clock by timing the switch from the at-speed PLL to the external clock source 19.

Once all fails have been detected, which is when n>M the decision block 63 branches to the reset ABIST controller block 67, the ABIST engine 200, is reinitialized by the real ABIST controller block 67 to execute the test again. The ABIST test is executed to the failing tester "execute to fail cycle-1" block 68, where the "Set PLL in BYPASS at n/M cycle" block 69 is used to disable the internal OPCG 250 at the correct multiple of the external clock cycle determined by each strobed point within each of the failing tester external clock cycles. The BYPASS block 69 must have external I/O pin control, a BYPASS signal path delay to the OPCG disable function smaller than the multiplied OPCG $t_{CYC}$ (Cycle Time), and the OPCG design must be able to freeze its output at the desired cycle.

Figure 6:
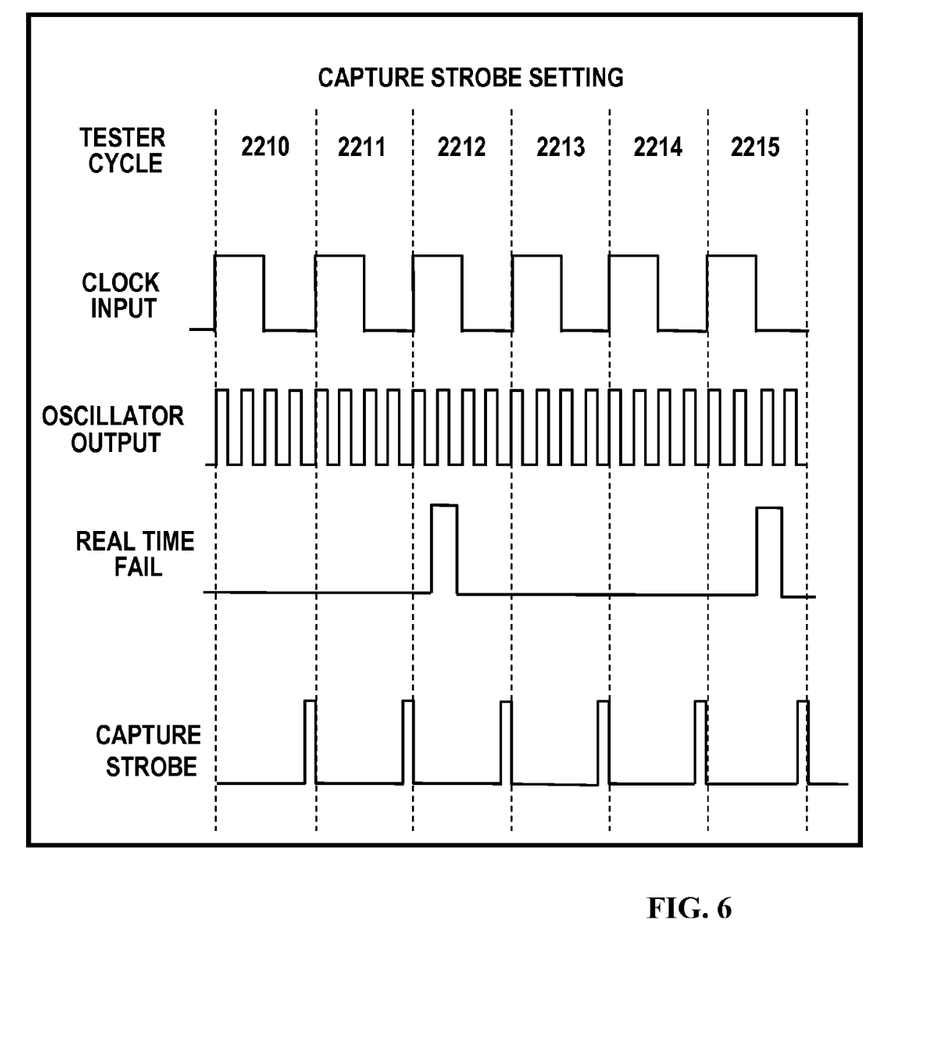
FIG. 6. illustrates how during data collection the recorded failing RTF sub-cycles are used to determine the edge placement of the BYPASS signal in FIG. 2 within the testers external (reference) clock cycle.

FIG. 6 illustrates how during data collection the recorded failing RTF sub-cycles are used to determine the edge placement of the PLL BYPASS signal on PLL bypass output line 10 in FIG. 2 within the testers external clock cycle.

The present invention provides the ability to stop on the exact internal cycle required to preserve each failing dataout while running at speed and then to unload the latched failing data at the tester $t_{CYC}$ to identify all of the failing memory cell locations.

Some reference parameters including the following parameters. 1) The multiply factor of the PLL (M); 2) The Cycle Time of the External Oscillator (CT); 3) The pipeline length of the RTF (m and n); 4) The External Cycle in which the RTF occurred (FRC); and 5) The placement of the Capture Strobe when the RTF was detected as a fraction of External Oscillator cycle. This would be the ABIST pass (s), divided by the multiplier (M), or s/M.

To stop on the required cycle, the external oscillator in the external clock 19 is pulsed for a cycle count in block 68, determined by the following equation, which the result truncated to the nearest integer:

$$(FRC-1)+(s/M)-(n/M)=\text{Result rounded down is Last External Clock Cycle}$$

Then in block 69 the command is "SET PLL IN BYPASS AT n/M CYCLE which operates to place the OPCG 250 in PLL BYPASS mode by a PLL bypass clock signal on PLL bypass output line 10 from the bypass signal generator 9 in the cycle after the last external clock on line 20 and is offset from the beginning of the cycle by the fractional part of the above result.

As an example, the external oscillator in the external signal generator 9 has a Cycle Time of 10 nsec (CT=10) and the OPCG 250 is operating with a multiplier of 4 (M=4). The pipe length to the Real Time Fail Pin (RTFP) for the Array Data is 5 (n=5). The Real Time Fail (RTF) is observed in External Cycle 100 (FRC=100), on the third pass of ABIST (s=3). The equation would be:

$$(100-1)+(3/4)-(5/4)=98\frac{1}{2}.$$

This external oscillator would be stopped after cycle 98 and the OPCG output on line 40 in BYPASS ½ cycle into the 99th External Clock cycle. This then stops the high speed PLL clocks on line 20M to the ABIST engine 270 at the point at which the failing data is latched into the array data output register, continuing with the external clock signal from the external clock 19. Then in step 70 the failing array data can then be unloaded, i.e. scanned off the DUT 140 (i.e. the chip) and the exact failing at-speed data can be observed.

Figure 7:
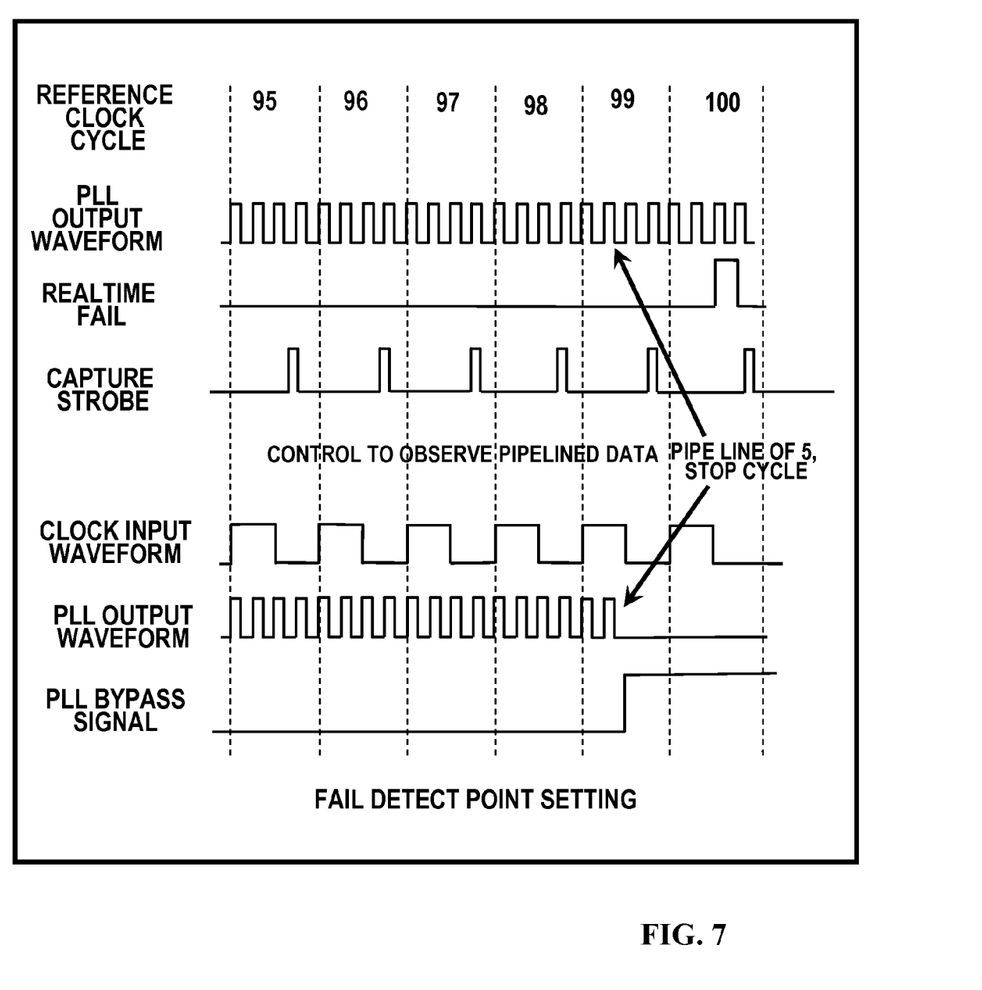
FIG. 7 illustrates that in order to capture the failing address, the pipeline for the address M is substituted in the equation for the pipeline n and the same technique is applied.

FIG. 7 illustrates that in order to capture the failing address, the pipeline for the address M is substituted in the equation for the pipeline n and the same technique is applied. The failing address and Data Out are then identified for further diagnostic analysis. Using these controls we are able to run the ABIST engine 270 at speed to induce the fail caused by the cycle time sensitive defect.

Referring again to FIG. 5, then after step 70 during which the ABIST engine 270 has operated on the exact cycle of interest to observe the fail data, by a scan unload in block 70 of the ABIST engine 270 into a storage device such as the RAM 362 in FIG. 2. The process is repeated by the test block 71, until data has been collected on each of the stored array fail cycles 72.

This technique has successfully been used to diagnose and identify AC defect in arrays on IBM® 300 mm MicroElectronics chip sets. This method provides a fully automated method of isolating at speed AC defects to every memory cell within an embedded array for further physical failure analysis and also provides AC full bit fail maps for volume AC data analysis and process line learning of complex AC defects.

The capabilities of the present invention can be implemented in software, computer usable media, firmware, hardware or some combination thereof.

For example, one or more aspects of the present invention can be included in an article of manufacture (e.g., one or more computer program products) having, for instance, computer usable media. The computer usable media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for implementing at speed bit fail mapping of a memory system embedded on a chip with Array Built In Self Testing (ABIST) system, comprising:
    testing said chip with an external tester comprising an off-chip device by applying an external clock operating at a first frequency to said chip;
    generating an internal high speed multiple of said external clock at said first frequency to sequence ABIST bit fail testing of said embedded memory system;
    detecting which cycle of said high speed multiplied clock corresponds to a fail occurring during ABIST testing of said memory system;
    performing a predetermined number of ABIST runs before issuing a bypass order substituting said external clock for said high speed multiplied clock;
    using said external clock of said external tester to read bit fail data out to said external tester
    storing a location of a said fail in a memory in said ATE tester upon recognition of said fail without requiring a scan operation off said chip to said ATE tester;
    applying an internal high speed clock to said ABIST system until a plurality of runs have been completed to store real time fail data;
    applying said external clock to said ABIST system after said plurality of runs; and
    then unloading real time fail data into said off-chip device.

2. The method of claim 1 wherein detection of a failing cycle is performed independently of a programmed multiplier used to create said internal high speed clock.

3. The method of claim 1 wherein:
    each fail occurrence at a specific phase of said internal high speed clock is stored and detected by external Automated Test Equipment (ATE);
    whereby detection of the an exact failing cycle is accomplished without interrupting an at-speed test.

4. The method of claim 1, including:
    said off-chip device comprising an Automatic Test Equipment (ATE) tester using an on-chip clock multiplier to produce frequency multiplication of said external clock of said ATE tester to generate said internal high speed clock;
    detecting a fail during n at-speed cycles thereby allowing for execution to a precise execution cycle of a test; and propagating fail data to said ATE tester from on-chip detection and storage circuitry after a number of cycles of testing with said internal high speed clock.

5. A method for high speed bit fail mapping of an embedded memory in a chip having an ABIST (Array Built In Self Testing) system by an external tester having an external clock with minimal interaction from said external tester with said external clock operating at a first clock frequency, comprising:
   running ABIST testing with an On Chip Clock Generator (OPCG) providing an at-speed internal clock with a frequency comprising a multiple of said first clock frequency for said ABIST testing; and
   then bypassing an at-speed oscillator on an exact cycle of ABIST execution;
   storing a location of a said fail in a memory in said ATE tester upon recognition of said fail without requiring a scan operation off said chip to said ATE tester;
   applying an internal high speed clock to said ABIST system until a plurality of runs have been completed to store real time fail data;
   applying said external clock to said ABIST system after said plurality of runs; and
   then unloading said real time fail data into an off-chip device.

6. The method of claim 5 including bit fail mapping of an embedded Random Access Memory (RAM).

7. The method of claim 6, including using an on-chip clock multiplier to multiply said external clock to generate a high speed multiplied clock.

8. The method of claim 7, including using said on-chip clock multiplier to multiply said external clock of an off-chip Automatic Test Equipment (ATE) tester to generate said high speed multiplied clock.

9. The method of claim 8, including:
   storing fail location data of a fail in fail location latches in a results register in an ABIST engine upon recognition of a said fail; and
   unloading fail data, and loading said fail data to an external memory device upon completion of at least a multiple of M cycles of ABIST fail testing.

10. The method of claim 9 comprising:
    providing a first input from said external clock;
    providing a second input from an internal high speed multiplied clock, and
    passing of either said first input from said external clock or said second input from said high speed multiplied clock to said ABIST system.

11. A circuit for implementing at speed bit fail mapping of an embedded memory system having an Array Built In Self Testing (ABIST) engine on a chip, comprising:
    an off-chip tester connected to apply an external clock operating at a first frequency to said chip;
    an internal clock operating at a high frequency comprising a multiple of said first frequency which sequences ABIST bit fail testing of said embedded memory system;
    detecting which cycle of said internal clock corresponds to a fail occurring during ABIST testing of said embedded memory system;
    said circuit performing a predetermined number of ABIST runs before issuing a bypass order substituting said external clock for said internal clock;
    said circuit using said external clock of the tester to read bit fail data out to said external tester; and
    during re-execution of a test, a failing cycle is exactly achieved by stopping said internal clock on an exact multiple of said external clock.

12. The circuit of claim 11 for automatic bit fail mapping of an embedded Random Access Memory (RAM),
    including an on-chip clock multiplier for multiplying the tester clock of an off-chip Automatic Test Equipment (ATE) tester to produce said high frequency of said internal clock,
    whereby execution of a test is not adversely affected by stopping clocks at a fail and then re-starting.

13. A computer program product for AC ABIST Diagnosis comprising a storage medium readable by a processor, capable of performing a method comprising:
    enabling at speed bit fail mapping of a memory system embedded in a chip employing: storage registers for data collection;
    observing data from said chip on any given cycle around a failing cycle to provide additional data for diagnosis;
    applying an internal high speed clock to an ABIST system until a plurality of runs have been completed to store real time fail data;
    applying an external clock to said ABIST system after said plurality of runs; and
    then unloading real time fail data into an off-chip device.

14. The program product of claim 13 including bit fail mapping of an embedded Random Access Memory (RAM).

15. The program product of claim 14 wherein an on-chip clock multiplier multiplies said external clock to generate a high speed multiplied clock.

16. The program product of claim 15 wherein said on-chip clock multiplier multiplies said external clock with an off-chip Automatic Test Equipment (ATE) tester to generate said high speed multiplied clock.

* * * * *